US010693231B2

(12) United States Patent
Dunworth et al.

(10) Patent No.: US 10,693,231 B2
(45) Date of Patent: Jun. 23, 2020

(54) TRANSMIT/RECEIVE SWITCHING CIRCUIT

(71) Applicant: QUALCOMM Incorporated, San Diego, CA (US)

(72) Inventors: Jeremy Dunworth, La Jolla, CA (US); Aliakbar Homayoun, Alamo, CA (US); Andrzej Partyka, Bedminster, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/997,575

(22) Filed: Jun. 4, 2018

(65) Prior Publication Data

US 2019/0081596 A1 Mar. 14, 2019

Related U.S. Application Data

(60) Provisional application No. 62/557,089, filed on Sep. 11, 2017.

(51) Int. Cl.
*H01Q 5/335* (2015.01)
*H04B 1/44* (2006.01)
(Continued)

(52) U.S. Cl.
CPC ........... *H01Q 5/335* (2015.01); *H01Q 1/2283* (2013.01); *H01Q 21/28* (2013.01); *H01Q 21/30* (2013.01);
(Continued)

(58) Field of Classification Search
CPC ......... H01Q 5/335; H03F 1/0277; H03F 1/56; H03F 3/211; H03F 3/68; H03F 2200/27;
(Continued)

(56) References Cited

U.S. PATENT DOCUMENTS 4,132,865 A 1/1979 Szechenyi
4,367,421 A 1/1983 Baker
(Continued)

FOREIGN PATENT DOCUMENTS

CN 1647401 A 7/2005
CN 1773844 A 5/2006
(Continued)

OTHER PUBLICATIONS

Chen H-S., et al., "A 52-GHz Full-Integrated RF Front-End by T/R Switch, LNA, and PA Co-Design with 3.2-dB NF and +25.9-dBm Output Power", IEEE Asian Solid-State Circuits Conference, Nov. 2015, 4 Pages.
(Continued)

Primary Examiner — Nguyen T Vo
(74) Attorney, Agent, or Firm — Seyfarth Shaw LLP/QUALCOMM Incorporated

(57) ABSTRACT

A transmit/receive switching circuit implementation reduces transmitting/receiving switching losses in a transceiver during different modes of operation. The implementation includes connecting a low noise amplifier and a power amplifier in accordance with a shunt configuration in the transceiver. The implementation also includes disabling the power amplifier to achieve a high impedance state by grounding an output stage bias and enabling the low noise amplifier and disabling one or more transistors connected to a path between the low noise amplifier and the power amplifier during a receive mode.

16 Claims, 8 Drawing Sheets

(51) Int. Cl.

| | | |
|---|---|---|
| *H03F 1/02* | (2006.01) | |
| *H03F 1/56* | (2006.01) | |
| *H03F 3/21* | (2006.01) | |
| *H03F 3/68* | (2006.01) | |
| *H03G 1/00* | (2006.01) | |
| *H04B 1/525* | (2015.01) | |
| *H03H 7/48* | (2006.01) | |
| *H01Q 1/22* | (2006.01) | |
| *H01Q 21/28* | (2006.01) | |
| *H01Q 21/30* | (2006.01) | |
| *H01Q 1/24* | (2006.01) | |
| *H01Q 21/06* | (2006.01) | |
| *H04B 1/00* | (2006.01) | |

(52) U.S. Cl.
CPC ............ *H03F 1/0277* (2013.01); *H03F 1/56* (2013.01); *H03F 3/211* (2013.01); *H03F 3/68* (2013.01); *H03G 1/0088* (2013.01); *H03H 7/48* (2013.01); *H04B 1/006* (2013.01); *H04B 1/44* (2013.01); *H04B 1/525* (2013.01); *H01Q 1/246* (2013.01); *H01Q 21/062* (2013.01); *H01Q 21/065* (2013.01); *H03F 2200/27* (2013.01); *H03F 2200/294* (2013.01); *H03F 2200/405* (2013.01); *H03F 2200/451* (2013.01)

(58) Field of Classification Search
CPC ........ H03F 2200/294; H03F 2200/451; H03G 1/0088; H03H 7/48; H04B 1/44; H04B 1/525
See application file for complete search history.

(56) References Cited

U.S. PATENT DOCUMENTS

| | | | |
|---|---|---|---|
| 4,628,274 A | 12/1986 | Vittoz et al. | |
| 4,810,911 A | 3/1989 | Noguchi | |
| 4,965,530 A | 10/1990 | Katz | |
| 5,731,607 A | 3/1998 | Kohama | |
| 5,754,082 A | 5/1998 | Swanson et al. | |
| 5,784,687 A | 7/1998 | Itoh et al. | |
| 5,808,502 A | 9/1998 | Hui et al. | |
| 5,818,099 A | 10/1998 | Burghartz | |
| 5,825,227 A | 10/1998 | Kohama et al. | |
| 5,883,541 A | 3/1999 | Tahara et al. | |
| 5,933,046 A | 8/1999 | Ramet et al. | |
| 6,094,088 A | 7/2000 | Yano | |
| 6,097,266 A | 8/2000 | Nardozza et al. | |
| 6,147,551 A | 11/2000 | Hong | |
| 6,166,584 A | 12/2000 | De | |
| 6,208,202 B1 | 3/2001 | Kaufman et al. | |
| 6,215,355 B1 | 4/2001 | Meck et al. | |
| 6,229,375 B1 | 5/2001 | Koen | |
| 6,356,536 B1 | 3/2002 | Repke | |
| 6,400,252 B1 | 6/2002 | Smith et al. | |
| 6,703,682 B2 | 3/2004 | Aswell | |
| 6,751,470 B1 | 6/2004 | Ella et al. | |
| 6,774,684 B2 | 8/2004 | Wu et al. | |
| 6,804,502 B2 | 10/2004 | Burgener et al. | |
| 6,864,746 B2 | 3/2005 | Cheah et al. | |
| 6,897,701 B2 | 5/2005 | Chen et al. | |
| 6,978,149 B1 | 12/2005 | Morelli et al. | |
| 7,023,272 B2 | 4/2006 | Hung et al. | |
| 7,088,971 B2 | 8/2006 | Burgener et al. | |
| 7,095,066 B2 | 8/2006 | Lavine | |
| 7,106,121 B2 | 9/2006 | Hidaka et al. | |
| 7,132,844 B2 | 11/2006 | Hashimoto | |
| 7,142,042 B1 | 11/2006 | Henry | |
| 7,161,423 B2 | 1/2007 | Paul et al. | |
| 7,167,044 B2 | 1/2007 | Li et al. | |
| 7,173,471 B2 | 2/2007 | Nakatsuka et al. | |
| 7,199,635 B2 | 4/2007 | Nakatsuka et al. | |
| 7,236,044 B2 | 6/2007 | Talwalkar et al. | |
| 7,358,806 B2 | 4/2008 | Burns et al. | |
| 7,362,171 B2 | 4/2008 | Kunihiro | |
| 7,383,024 B2 | 6/2008 | Mueller et al. | |
| 7,385,445 B2 | 6/2008 | Wright | |
| 7,459,988 B1 | 12/2008 | Iversen | |
| 7,486,135 B2 | 2/2009 | Mu | |
| 7,525,396 B2 | 4/2009 | He et al. | |
| 7,639,075 B2 | 12/2009 | Lin | |
| 7,642,859 B2 | 1/2010 | Shimada | |
| 7,650,134 B2 | 1/2010 | Nakajima et al. | |
| 7,714,657 B2 | 5/2010 | Wu | |
| 7,719,352 B2 | 5/2010 | Kim et al. | |
| 7,738,841 B2 | 6/2010 | Ahn et al. | |
| 7,756,486 B1 | 7/2010 | Tan et al. | |
| 7,764,120 B2 | 7/2010 | Pengelly | |
| 7,801,556 B2 | 9/2010 | Tran et al. | |
| 7,848,712 B2 | 12/2010 | Fu et al. | |
| 7,890,063 B2 | 2/2011 | Ahn et al. | |
| 7,928,794 B2 | 4/2011 | Balboni | |
| 8,120,428 B2 | 2/2012 | Montalvo et al. | |
| 8,195,119 B2 | 6/2012 | Cassia et al. | |
| 8,229,367 B2 | 7/2012 | Chan et al. | |
| 8,232,850 B2 | 7/2012 | Roufoogaran et al. | |
| 8,395,435 B2 | 3/2013 | Cassia et al. | |
| 8,791,771 B2 | 7/2014 | Ding et al. | |
| 8,913,976 B2 | 12/2014 | Khatri et al. | |
| 9,124,354 B2 | 9/2015 | Ganti et al. | |
| 9,190,699 B2 | 11/2015 | Granger-Jones et al. | |
| 9,373,879 B2 | 6/2016 | Ehyaie | |
| 9,397,720 B2 | 7/2016 | Jerng et al. | |
| 9,735,469 B1 | 8/2017 | West et al. | |
| 10,116,347 B1* | 10/2018 | Xu .............. | H04B 1/00 |
| 2001/0050951 A1 | 12/2001 | Dellon et al. | |
| 2003/0112065 A1 | 6/2003 | Brown et al. | |
| 2004/0113746 A1 | 6/2004 | Brindle | |
| 2004/0246051 A1 | 12/2004 | Hsu et al. | |
| 2005/0014473 A1 | 1/2005 | Zhao et al. | |
| 2005/0197084 A1 | 9/2005 | Hamasaki et al. | |
| 2006/0189286 A1 | 8/2006 | Kyu et al. | |
| 2006/0199563 A1 | 9/2006 | Kelly et al. | |
| 2006/0202752 A1 | 9/2006 | Stephelbauer et al. | |
| 2006/0217090 A1 | 9/2006 | Pan | |
| 2006/0267666 A1 | 11/2006 | Toda | |
| 2007/0049237 A1 | 3/2007 | Miura et al. | |
| 2007/0060066 A1 | 3/2007 | Srinivasan | |
| 2007/0069291 A1 | 3/2007 | Stuber et al. | |
| 2007/0222523 A1 | 9/2007 | Arell | |
| 2007/0232241 A1 | 10/2007 | Carley et al. | |
| 2007/0281629 A1 | 12/2007 | Ahn et al. | |
| 2007/0290744 A1 | 12/2007 | Adachi et al. | |
| 2008/0064358 A1 | 3/2008 | Sagae et al. | |
| 2008/0290928 A1 | 11/2008 | Kawakyu et al. | |
| 2009/0045877 A1 | 2/2009 | Wang et al. | |
| 2010/0117713 A1 | 5/2010 | Katoh et al. | |
| 2010/0237945 A1 | 9/2010 | Cassia et al. | |
| 2010/0295629 A1 | 11/2010 | Klemens et al. | |
| 2011/0001544 A1 | 1/2011 | Ranta et al. | |
| 2011/0025403 A1 | 2/2011 | Cassia | |
| 2011/0025404 A1 | 2/2011 | Cassia | |
| 2011/0148503 A1 | 6/2011 | Granger-Jones et al. | |
| 2011/0176245 A1 | 7/2011 | Worley et al. | |
| 2011/0260774 A1 | 10/2011 | Granger-Jones et al. | |
| 2011/0260780 A1 | 10/2011 | Granger-Jones et al. | |
| 2014/0199951 A1* | 7/2014 | Yu .............. | H04B 1/44 455/83 |
| 2015/0333791 A1* | 11/2015 | Anderson ........... | H04B 1/44 455/83 |
| 2016/0126921 A1 | 5/2016 | Hur et al. | |
| 2017/0047667 A1 | 2/2017 | Sarkar et al. | |
| 2017/0214417 A1 | 7/2017 | Jian | |
| 2019/0081399 A1 | 3/2019 | Ku et al. | |

FOREIGN PATENT DOCUMENTS

| | | |
|---|---|---|
| CN | 1841923 A | 10/2006 |
| CN | 101369803 A | 2/2009 |
| CN | 101369803 B | 5/2011 |
| DE | 102008004861 | 7/2009 |
| DE | 102008004861 A1 | 7/2009 |

(56) References Cited

FOREIGN PATENT DOCUMENTS

| | | |
|---|---|---|
| EP | 1560331 A1 | 8/2005 |
| EP | 1693957 A1 | 8/2006 |
| EP | 1708361 A2 | 10/2006 |
| EP | 1793493 A1 | 6/2007 |
| JP | H08307305 A | 11/1996 |
| JP | H10242826 A | 9/1998 |
| JP | 2001160724 A | 6/2001 |
| JP | 2001217701 A | 8/2001 |
| JP | 2002057599 A | 2/2002 |
| JP | 2004015409 A | 1/2004 |
| JP | 2006050074 A | 2/2006 |
| JP | 2006237711 A | 9/2006 |
| JP | 2006279963 A | 10/2006 |
| JP | 2006332778 A | 12/2006 |
| JP | 2008011120 A | 1/2008 |
| JP | 2008294726 A | 12/2008 |
| JP | 2009010826 A | 1/2009 |
| JP | 2009065304 A | 3/2009 |
| KR | 20040074278 A | 8/2004 |
| TW | I224418 B | 11/2004 |
| WO | 2007085866 A1 | 8/2007 |
| WO | 2007105282 A1 | 9/2007 |
| WO | 2008103757 A1 | 8/2008 |
| WO | 2008145604 A1 | 12/2008 |
| WO | 2009009494 A2 | 1/2009 |
| WO | 2010132699 | 11/2010 |
| WO | 2011019850 A1 | 2/2011 |
| WO | 2011091064 A1 | 7/2011 |

OTHER PUBLICATIONS

Huang C-W.P., et al., "Novel double pole double throw switchplexer that simplifies dual-band WLAN and MIMO front-end module designs," Microwave Symposium Digest, 2008 IEEE MTT-S International, Jun. 15-20, 2008, pp. 1183-1186.

Balducci M., et al., "Ka Band Passive Differential 4:1 Power Divider/combiner Based on Wilkinson Topology", 2017 13th Conference on Ph.d. Research in Microelectronics and Electronics (PRIME), IEEE, Jun. 12, 2017, XP033119699, DOI: 10.1109/PRIME.2017.7974139 [retrieved on Jul. 10, 2017], pp. 189-192.

Chung Y., et al., "Power Routing Scheme With Dual Operating Modes: Two-Way Wilkinson Divider and One-way Signal Path", Electronics Letters, Jan. 1, 2004, vol. 40, No. 2, pp. 129-130, XP055516490, GB ISSN: 0013-5194, DOI: 10.1049/el:20040082.

Ahsan N., et al., "Dual Band Tunable LNA for Flexible RF Front End", IEEE, Proceedings of International Bhurban Conference on Applied Sciences And Technology (IBCAST 2007), (Jan. 1, 2007), pp. 19-22.

Bloom I., et al., "1/F Noise Reduction of Metal-Oxide-Semiconductor Transistors by Cycling from Inversion to Accumulation", Applied Physics Letters, AIP Publishing LLC, US, vol. 58, No. 15, Apr. 15, 1991 (Apr. 15, 1991), pp. 1664-1666, XP000208382, ISSN: 0003-6951, DOI: 10.1063/1.105130.

Henzler S., et al., "Power Management of Digital Circuits in Deep Sub-Micron CMOS Technologies", Nov. 24, 2006 (Nov. 24, 2006), pp. 61-62, XP055580276.

Liscidini A., et al., "A 0.13 μm CMOS Front-End, for Dcs1800/UMTS/802.11b-g With Multiband Positive Feedback Low-Noise Amplifier", Solid-State Circuits, IEEE Journal of, vol. 41, No. 4, Apr. 2006, pp. 981-989.

Moreira C.P., et al., "A Reconfigurable DCS1800/W-CDMA LNA: Design and Implementation Issues", IEEE, Proceedings of the 36th European Microwave Conference, 2006, (Sep. 1, 2006), pp. 1652-1655.

Jin Y., et al, "Ultra-compact high-linearity high-power fully integrated DC-20-GHz 0.18-μm CMOS T/R switch", IEEE Transactions on Microwave Theory and Techniques, vol. 55, Issue. 1, Feb 2007, pp. 30-36.

Kuhn W.B., et al., "A Resonant Switch for LNA Protection in Watt-Level CMOS Transceivers", IEEE Transactions on Microwave Theory and Techniques, vol. 53, Issue: 9, Sep. 2005, pp. 2819-2825.

Yao W., "Digital Controlled Antenna and Antenna Array in Wireless Communication", University of California Los Angeles, 2005, 24 pages.

* cited by examiner

TRANSMIT/RECEIVE SWITCHING CIRCUIT

CROSS-REFERENCE TO RELATED APPLICATION

The present application claims the benefit of U.S. Provisional Patent Application No. 62/557,089, filed on Sep. 11, 2017, and titled "CONFIGURABLE POWER COMBINER AND SPLITTER," the disclosure of which is expressly incorporated by reference herein in its entirety.

TECHNICAL FIELD

The present disclosure generally relates to switching between transmitting and receiving. More specifically, the present disclosure relates to a tri-state transmit/receive switch for reducing transmitting/receiving switching losses in a transceiver.

BACKGROUND

Mobile radio frequency (RF) chip designs (e.g., mobile RF transceivers) have migrated to deep sub-micron process nodes due to cost and power consumption considerations. The design complexity of mobile RF transceivers is further complicated by added circuit function and devices to support communication enhancements.

A mobile RF transceiver includes a transmitter and a receiver, which are capable of transmitting and receiving communication signals, respectively. Conventionally, the transmitter's analog front end contains a power amplifier (PA) that provides the last stage of amplification of the signal to be transmitted, while the receiver's analog front end contains a low noise amplifier (LNA) that provides the initial stage of amplification of the signal to be received. In a wireless communication system, the transmit PA and receive LNA may each couple to a shared antenna through separate impedance matching networks and a common transmit/receive (T/R) switch through which both the high power transmit signal and the low power receive signal pass.

SUMMARY

In an aspect of the present disclosure, a transmit/receive switching circuit includes an antenna node, a power amplifier coupled to the antenna node and a first switch coupled to the antenna node. The transmit/receive switching circuit also includes a low noise amplifier coupled to the first switch. The first switch is in shunt with the low noise amplifier. Further, the transmit/receive switching circuit includes an inductor that couples the antenna node to the first switch. Furthermore, the transmit/receive switching circuit includes a transformer that couples the power amplifier to the antenna node.

In another aspect of the present disclosure, a transmit/receive switching circuit includes an antenna node, a means for amplifying a signal to the antenna node and a first switch coupled to the antenna node. The amplifying means is coupled to the antenna node. The transmit/receive switching circuit also includes a low noise amplifier coupled to the first switch. The first switch is in shunt with the low noise amplifier. Further, the transmit/receive switching circuit includes an inductor that couples the antenna node to the first switch. Furthermore, the transmit/receive switching circuit includes a transformer that couples the amplifying means to the antenna node.

In yet another aspect of the present disclosure, a method of communicating using a transceiver includes connecting a low noise amplifier and a power amplifier in accordance with a shunt configuration in the transceiver. The method further includes disabling the power amplifier to achieve a high impedance state by grounding an output stage bias and enabling the low noise amplifier and disabling one or more transistors connected to a path between the low noise amplifier and the power amplifier during a receive mode.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
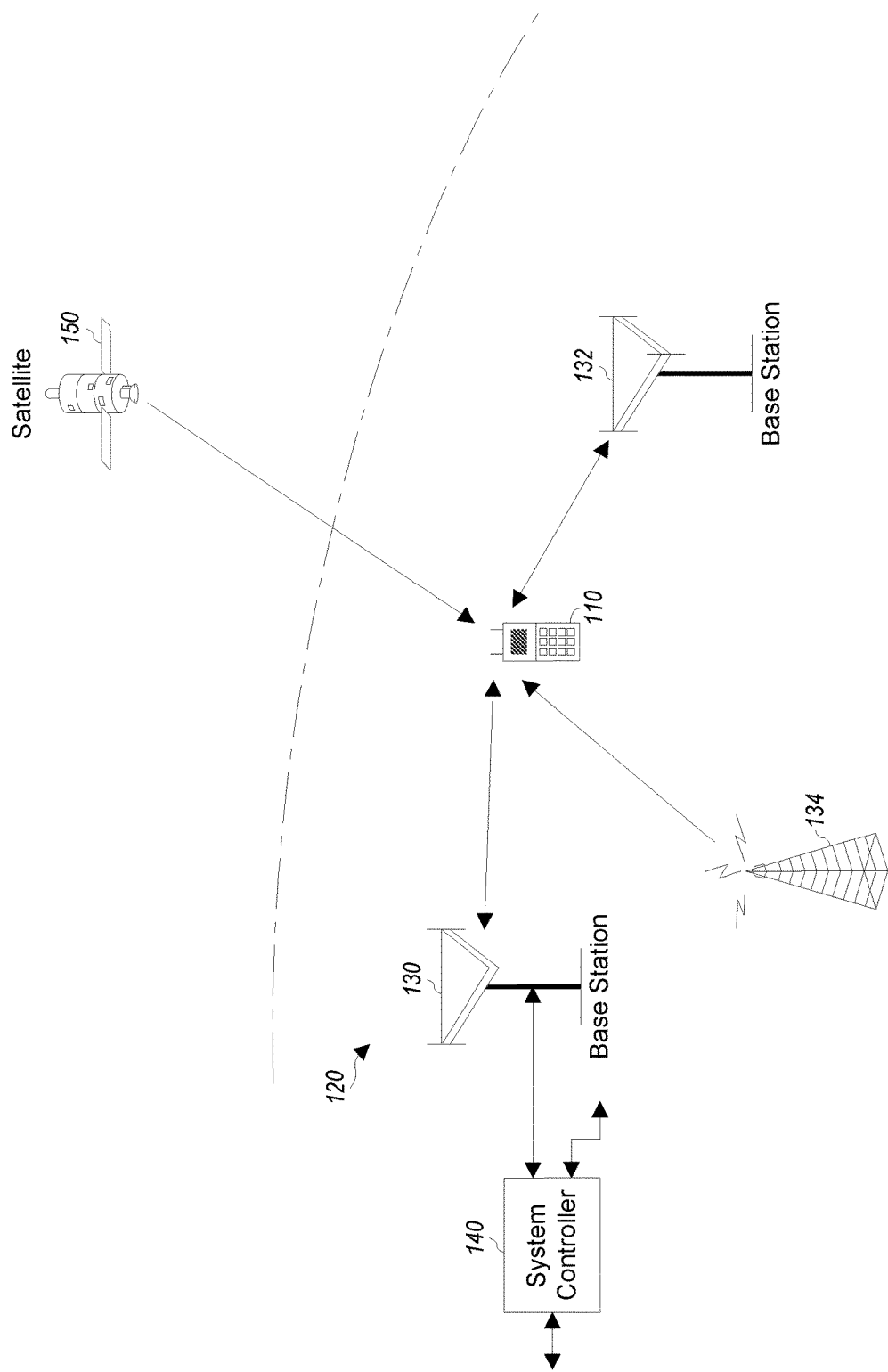
FIG. 1 shows a wireless device communicating with a wireless communication system.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Currently developing next generation cellular technologies (5G) in millimeter wave (mmW) bands desire low cost phased-array transceivers. Even with the benefit of beam forming, due to space constraints in a mobile form factor, increasing transmit output power while maintaining acceptable power added efficiency (PAE) of a power amplifier (PA), noise factor (NF) of a low noise amplifier (LNA), and overall transceiver power consumption, it is important to maximize link budget allowable path loss and to minimize handset case temperature. Additionally, the phased-array transceiver is specified to support dual polarization communication.

A transceiver (e.g., the phased-array transceiver) may be subject to losses associated with switching between transmitting and receiving. The switching losses are minimized or reduced by connecting the power amplifier and the low noise amplifier in shunt with each other. An output stage of the power amplifier is a differential pair with capacitive neutralization.

Aspects of the present disclosure incorporate methods for reducing transmitting/receiving switching losses in the transceiver during different modes of operation. For example, the low noise amplifier and the power amplifier of the transceiver are connected in accordance with a shunt configuration. In the receive mode, the power amplifier is disabled to achieve a high impedance state by grounding an output stage bias while enabling the low noise amplifier. One or more transistors connected in parallel to a path between the low noise amplifier and the power amplifier are also disabled. The one or more transistors may be a first transistor and a second transistor.

In a transmit mode, the power amplifier is enabled and the low noise amplifier is disabled while the first transistor and the second transistor connected in parallel to the path between the low noise amplifier and the power amplifier are enabled to achieve high inductive impedance from the low noise amplifier from a perspective of the power amplifier. The high inductive impedance may be achieved based on resonance between a pad capacitance at a node (e.g., an antenna node) coupled to an antenna and an inductance of a matching network inductor between the node and the low noise amplifier. The first switch or transistor is coupled to the antenna node and is in shunt with the power amplifier and the low noise amplifier. The matching network inductor is also between the antenna node and the first switch. A transformer or balun may be between the power amplifier and the antenna node. In an off mode, the power amplifier and the low noise amplifier are disabled while enabling the first transistor and disabling the second transistor.

The aspects of the present disclosure may be implemented in a base station or a user equipment. The aspects of the present disclosure may be implemented in the system of FIGS. 1 and 8. More specifically, aspects of the present disclosure may be implemented in the wireless device of FIG. 2.

FIG. 1 shows a wireless device 110 communicating with a wireless communication system 120 and having the transmit/receive switching circuit. The wireless device 110 includes a configurable power combiner and splitter (CPCS) for fifth generation (5G) millimeter wave front-ends. The wireless communication system 120 may be a 5G system, a long term evolution (LTE) system, a code division multiple access (CDMA) system, a global system for mobile communications (GSM) system, a wireless local area network (WLAN) system, millimeter wave (mmW) technology, or some other wireless system. A CDMA system may implement wideband CDMA (WCDMA), time division synchronous CDMA (TD-SCDMA), CDMA2000, or some other version of CDMA. In a millimeter wave (mmW) system, multiple antennas are used for beamforming (e.g., in the range of 30 GHz, 60 GHz, etc.). For simplicity, FIG. 1 shows the wireless communication system 120 including two base stations 130 and 132 and one system controller 140. In general, a wireless system may include any number of base stations and any number of network entities.

A wireless device 110 may be referred to as a user equipment (UE), a mobile station, a terminal, an access terminal, a subscriber unit, a station, etc. The wireless device 110 may also be a cellular phone, a smartphone, a tablet, a wireless modem, a personal digital assistant (PDA), a handheld device, a laptop computer, a Smartbook, a netbook, a cordless phone, a wireless local loop (WLL) station, a Bluetooth device, etc. The wireless device 110 may be capable of communicating with the wireless communication system 120. The wireless device 110 may also be capable of receiving signals from broadcast stations (e.g., a broadcast station 134), signals from satellites (e.g., a satellite 150) in one or more global navigation satellite systems (GNSS), etc. The wireless device 110 may support one or more radio technologies for wireless communication such as 5G, LTE, CDMA2000, WCDMA, TD-SCDMA, GSM, 802.11, etc.

The wireless device 110 may support carrier aggregation, which is operation on multiple carriers. Carrier aggregation may also be referred to as multi-carrier operation. According to an aspect of the present disclosure, the wireless device 110 may be able to operate in low-band from 698 to 960 megahertz (MHz), mid-band from 1475 to 2170 MHz, and/or high-band from 2300 to 2690 MHz, ultra-high band from 3400 to 3800 MHz, and long-term evolution (LTE) in LTE unlicensed bands (LTE-U/LAA) from 5150 MHz to 5950 MHz. Low-band, mid-band, high-band, ultra-high band, and LTE-U refer to five groups of bands (or band groups), with each band group including a number of frequency bands (or simply, "bands"). For example, in some systems each band may cover up to 200 MHz and may include one or more carriers. For example, each carrier may cover up to 40 MHz in LTE. Of course, the range for each of the bands is merely exemplary and not limiting, and other frequency ranges may be used. LTE Release 11 supports 35 bands, which are referred to as LTE/UMTS bands and are listed in 3GPP TS 36.101. The wireless device 110 may be configured with up to five carriers in one or two bands in LTE Release 11.

Figure 2:
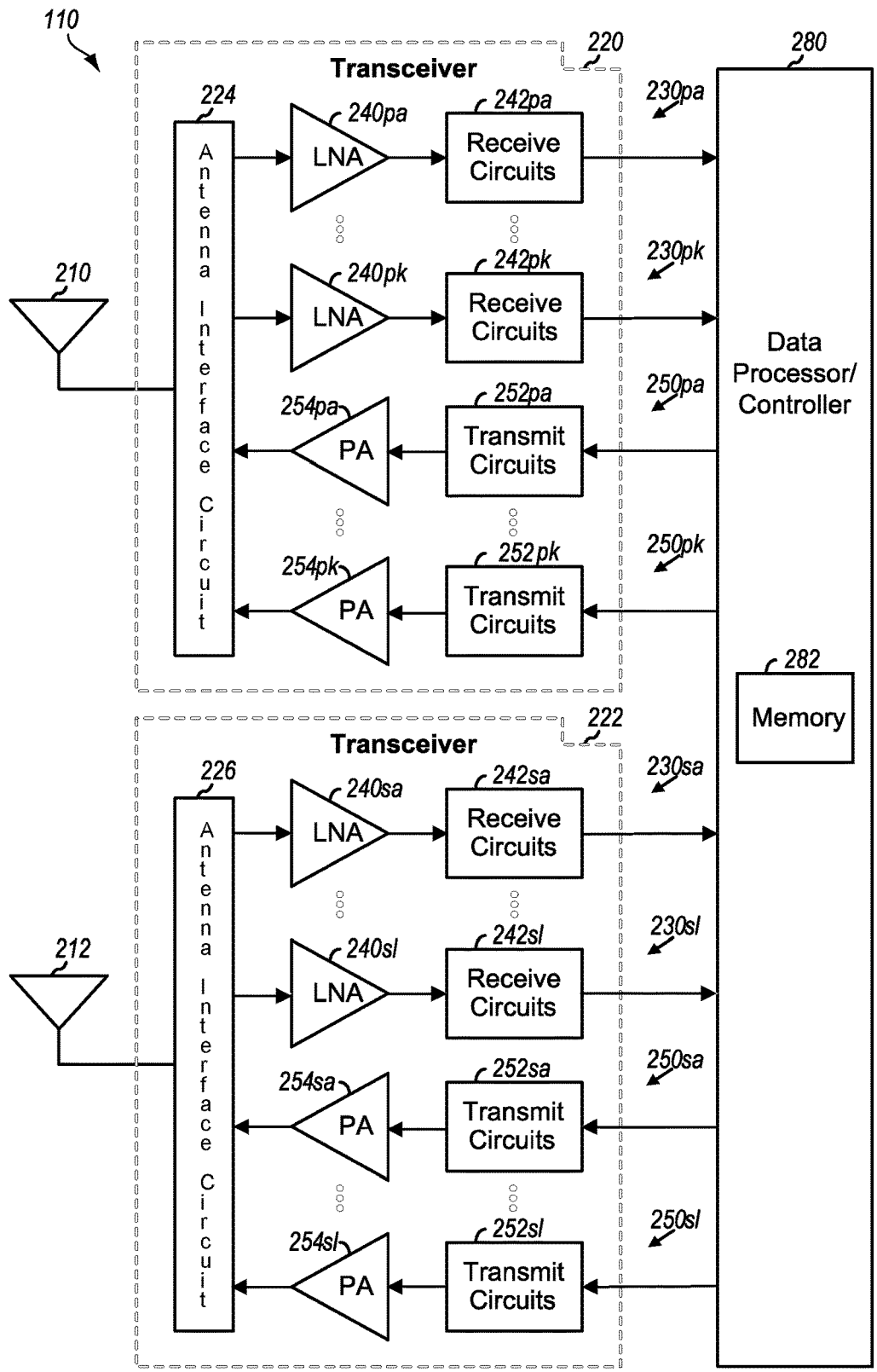
FIG. 2 shows a block diagram of the wireless device in FIG. 1, according to an aspect of the present disclosure.

FIG. 2 shows a block diagram of an exemplary design of wireless device 110 in FIG. 1. In this exemplary design, the wireless device 110 includes a transceiver 220 coupled to a primary antenna 210, a transceiver 222 coupled to a secondary antenna 212, and a data processor/controller 280. The transceiver 220 includes multiple (K) receivers 230pa to 230pk and multiple (K) transmitters 250pa to 250pk to support multiple frequency bands, multiple radio technologies, carrier aggregation, etc. The transceiver 222 includes L receivers 230*sa* to 230*sl* and L transmitters 250*sa* to 250*sl* to support multiple frequency bands, multiple radio technologies, carrier aggregation, receive diversity, multiple-input multiple-output (MIMO) transmission from multiple transmit antennas to multiple receive antennas, etc.

In the exemplary design shown in FIG. 2, each receiver 230 includes an LNA 240 and receive circuits 242. For data reception, the antenna 210 receives signals from base stations and/or other transmitter stations and provides a received radio frequency (RF) signal, which is routed through an antenna interface circuit 224 and presented as an input RF signal to a selected receiver 230. An antenna interface circuit 224 may include switches, duplexers, transmit filters, receive filters, matching circuits, etc. The description below assumes that the receiver 230*pa* is the selected receiver. Within the receiver 230*pa*, an LNA 240*pa* amplifies the input RF signal and provides an output RF signal. Receive circuits 242*pa* downconvert the output RF signal from RF to baseband, amplify and filter the downconverted signal, and provide an analog input signal to data processor 280. Receive circuits 242*pa* may include mixers, filters, amplifiers, matching circuits, an oscillator, a local oscillator (LO) generator, a phase locked loop (PLL), etc. Each remaining receiver 230 in the transceivers 220 and 222 may operate in a similar manner as the receiver 230*pa*.

In the exemplary design shown in FIG. 2, each transmitter 250 includes transmit circuits 252 and a power amplifier (PA) 254. For data transmission, a data processor 280 processes (e.g., encodes and modulates) data to be transmitted and provides an analog output signal to a selected transmitter. The description below assumes that the transmitter 250*pa* is the selected transmitter. Within the transmitter 250*pa*, transmit circuits 252*pa* amplify, filter, and upconvert the analog output signal from baseband to RF and provide a modulated RF signal. The transmit circuits 252*pa* may include amplifiers, filters, mixers, matching circuits, an oscillator, an LO generator, a PLL, etc. A power amplifier (PA) 254*pa* receives and amplifies the modulated RF signal and provides a transmit RF signal having the proper output power level. The transmit RF signal is routed through the antenna interface circuit 224 and transmitted via the antenna 210. Each remaining transmitter 250 in the transceivers 220 and 222 may operate in a similar manner as the transmitter 250*pa*.

FIG. 2 shows an exemplary design of a receiver 230 and transmitter 250. The receiver 230 and a transmitter 250 may also include other circuits not shown in FIG. 2, such as filters, matching circuits, etc. All or a portion of transceivers 220 and 222 may be implemented on one or more analog integrated circuits (ICs), RF ICs (RFICs), mixed-signal ICs, etc. For example, LNAs 240 and receive circuits 242 within transceivers 220 and 222 may be implemented on multiple ICs, as described below. The circuits in transceivers 220 and 222 may also be implemented in other manners.

The data processor/controller 280 may perform various functions for the wireless device 110. For example, the data processor 280 may perform processing for data being received via the receivers 230 and data being transmitted via the transmitters 250. The controller 280 may control the operation of the various circuits within the transceivers 220 and 222. In some aspects, the transceivers 220 and 222 may also comprise a controller to control various circuits within the respective transceiver (e.g., LNAs 240). A memory 282 may store program codes and data for the data processor/controller 280. The data processor/controller 280 may be implemented on one or more application specific integrated circuits (ASICs) and/or other ICs.

Figure 3:
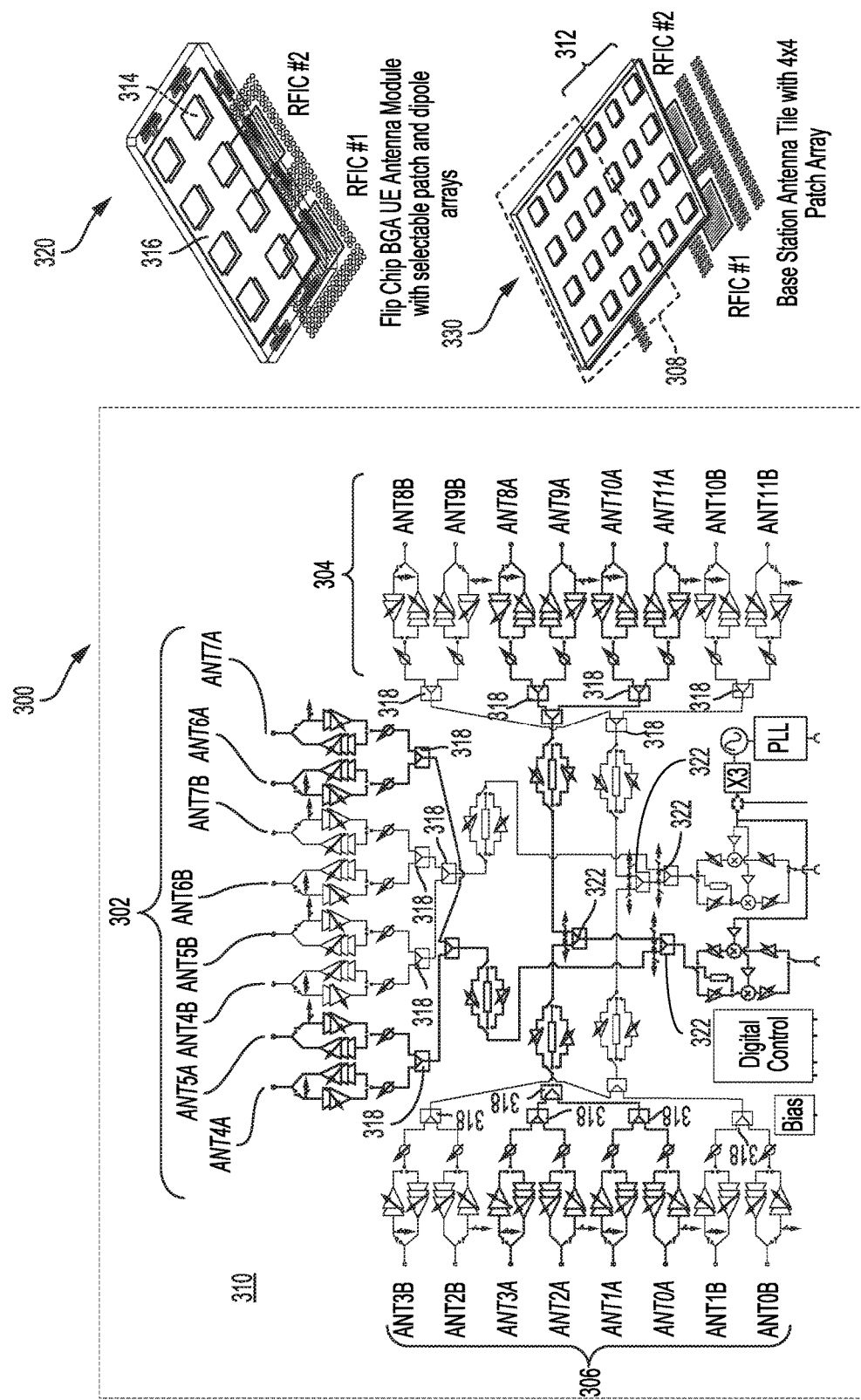
FIG. 3 illustrates an example of a radio frequency integrated circuit (RFIC) architecture and exploded views of two antenna modules into which the radio frequency integrated circuit is integrated.

FIG. 3 illustrates an example of a radio frequency integrated circuit (RFIC) architecture 300 including an RFIC 310 and exploded views of two antenna modules into which the radio frequency integrated circuit 310 is integrated. A first antenna module 320 of the two antenna modules is a user equipment (UE) module. A second antenna module 330 of the two antenna modules is a base station module. Each of the antenna modules 320 and 330 includes a flat rectangular sheet or "patch" of metal (or conductive material) 314, mounted over a larger sheet of metal (or conductive material) called a ground plane 316.

The antenna module 320 may be a flip chip ball grid array (BGA) UE antenna module with selectable patch and dipole arrays. For example, the UE module 320 uses the RFIC 310 in pairs (e.g., RFIC #1 and RFIC #2) to enable testing of different UE antenna arrays such as 1×4 dipole, 1×4 patch, 2×2 patch, and 2×4 patch. In a base station (BS) array tile, a 4×4 patch array 308 is active with two rows 312 of dummy patches on one edge. The RFIC 310 is divided into six groups of 4-channel sub-arrays, one for each polarization on the top (e.g., first sub-array of antennas 302), right (e.g., second sub-array of antennas 304), and left (e.g., third sub-array of antennas 306) of a die.

A first of the six groups of 4-channel sub-arrays with polarization "A" includes antennas ANT0A, ANT1A, ANT2A, and ANT3A. A second of the six groups of 4-channel sub-arrays with polarization "A" includes antennas ANT4A, ANT5A, ANT6A, and ANT7A. A third of the six groups of 4-channel sub-arrays with polarization "A" includes antennas ANT8A, ANT9A, ANT10A, and ANT11A. A fourth of the six groups of 4-channel sub-arrays with polarization "B" includes antennas ANT0B, ANT1B, ANT2B, and ANT3B. A fifth of the six groups of 4-channel sub-arrays with polarization "B" includes antennas ANT4B, ANT5B, ANT6B, and ANT7B. A sixth of the six groups of 4-channel sub-arrays with polarization "B" includes antennas ANT8B, ANT9B, ANT10B, and ANT11B.

In one aspect, lumped element Wilkinson power combiners (e.g., 318) are used in the sub-arrays and configurable power combiners/splitters (e.g., 322) are used in the center of the RFIC 310 to allow either combining or switching of the sub-arrays. In some aspects, lumped element Wilkinson power combiners (e.g. 318) could be replaced by configurable power combiners/splitters (e.g., 322). The placement of the configurable power combiner splitter may be based on a circuit architecture.

Figure 4:
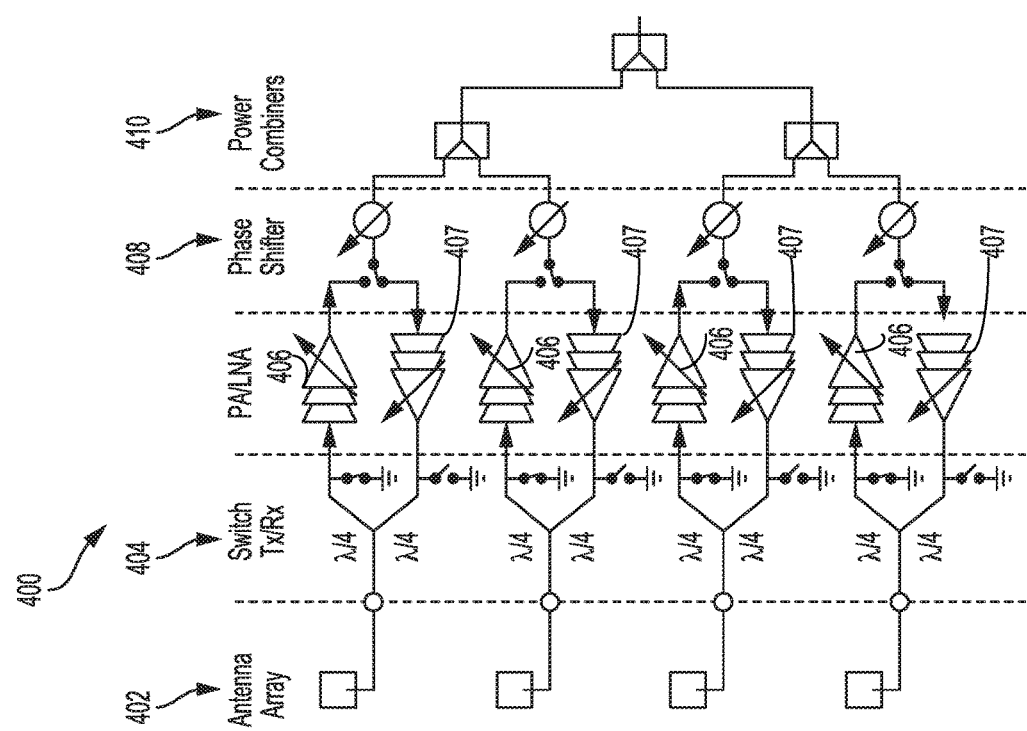
FIG. 4 illustrates an exemplary system including a configurable power combiner and splitter, according to aspects of the present disclosure.

FIG. 4 illustrates an exemplary system 400 including a configurable power combiner and splitter according to aspects of the present disclosure. The system 400 may be configured for a high frequency front-end (e.g., gigahertz frequency range or for fifth generation (5G) front-ends). The system 400 includes antenna arrays 402, transmit and receive switches 404, amplifiers 406 including power amplifiers and low noise amplifiers, phase shifters 408, and configurable combiners and splitters 410. The high frequency configurable combiners and splitters 410 may be used for a phased-array. It is noted that for a millimeter wave (mmW) phased-array front-end, an in-phase power combiner and splitter network is a key component, especially if beam combining is done at an mmW/radio frequency (RF) path.

The transceiver may be subject to losses associated with switching between transmitting and receiving. The switching losses are minimized or reduced by connecting the power amplifier and the low noise amplifier in shunt with each other. An output stage of the power amplifier is a differential pair with capacitive neutralization. The power amplifier may be a millimeter wave (mmW) power amplifier.

Aspects of the present disclosure incorporate methods for reducing transmitting/receiving switching losses in the transceiver during different modes of operation.

Figure 5:
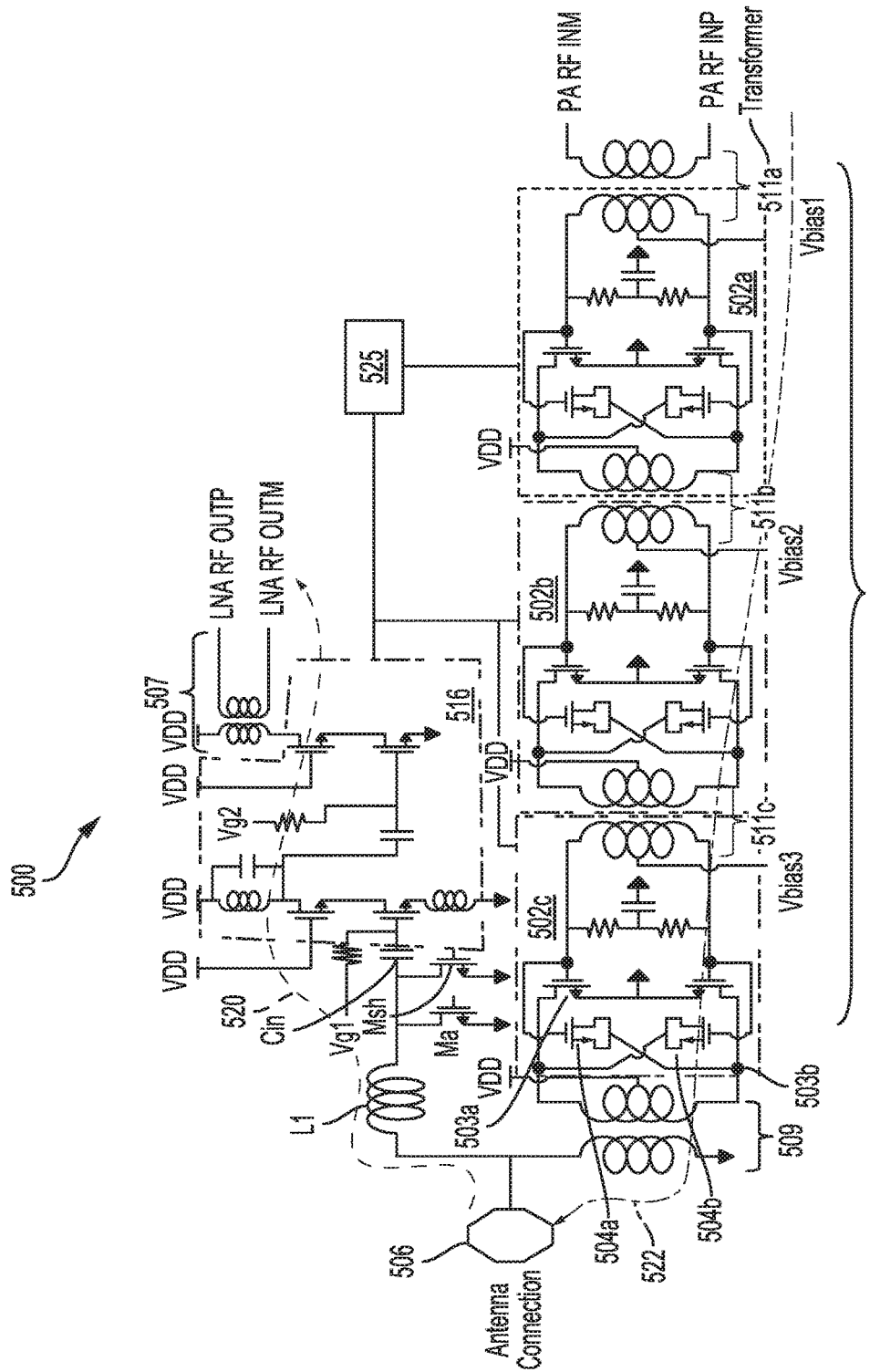
FIG. 5 shows one front end channel (1×CH) according to aspects of the present disclosure.

FIG. 5 shows one front end channel (1×CH) 500 according to aspects of the present disclosure. The front end channel 500 includes a receive path 520 and a transmit path 522. The receive path 520 includes an antenna connection or antenna node 506, an inductor L1, a first transistor or switch Ma, a second transistor or switch Msh, a capacitor Cin, a low noise amplifier (LNA) 516 (drawn as a two stage amplifier but the LNA could have fewer or more stages of amplification), and a receive path balun 507. The antenna node 506 is coupled to the inductor L1. Each of the first switch Ma and the second switch Msh are coupled to the receive path 520 in a shunt configuration. For example, a drain of the first switch Ma is coupled to the receive path 520 and a drain of the second switch Msh is coupled to the receive path 520. A gate of each of the first switch Ma and the second switch Msh is coupled to a controller 525 that generates a control signal for controlling the first switch Ma and the second switch Msh. A source of each of the first switch Ma and the second switch Msh may be grounded. In one aspect, the first switch Ma and the second switch may be a single shunt switch.

A voltage supply VDD may provide power to one or more stages of the low noise amplifier 516. In one aspect, the capacitor Cin may be a direct current blocking capacitor and/or a matching capacitor and may be coupled to an input of the low noise amplifier 516. The first switch Ma and the second switch Msh may be coupled between the inductor L1 and the capacitor Cin. In one aspect, the low noise amplifier 516 may be a single-ended low noise amplifier. An output of the low noise amplifier 516 may be coupled to the receive path balun 507. The receive path balun 507 may be a single-ended to differential balun that converts a single-ended output of the low noise amplifier 516 to a differential output.

The transmit path 522 includes the antenna node 506, a transmit path output balun 509, a power amplifier 502, and a transmit path input transformer 511. The antenna node 506 is coupled to the transmit path output balun 509. The transmit path output balun 509 is coupled to an output of the power amplifier 502. The transmit path input transformer 511 may be coupled to an input of the power amplifier 502. The DC blocking capacitor Cin is desirable to allow an LNA input (e.g., DC voltage) to be established by voltage Vg1 despite the fact that the antenna node 506 is DC connected to ground through an output of the transmit path output balun 509. For example, the DC blocking capacitor Cin allows control of a gate voltage of a low noise amplifier input stage of the low noise amplifier 516 to turn on the low noise amplifier.

The low noise amplifier input stage of the low noise amplifier 516 may be an inductively degenerated low noise amplifier common source input stage. For example, an inductively degenerated common source LNA input may be used in complementary metal oxide semiconductor (CMOS) radio frequency circuit designs to allow the LNA, when it is active, to have both an acceptable noise figure and acceptable input impedance. For example, an input impedance to the inductively degenerated low noise amplifier stage looks real in combination with capacitive reactive impedance due to the gate capacitance of the low noise amplifier input stage and the parasitic capacitance associated with the capacitor Cin. Thus, an inductor (e.g., L1) is desirable to tune out the capacitor part and complete the low noise amplifier input noise and impedance match.

In one aspect, the power amplifier 502 may be a differential power amplifier stage. An output of the power amplifier 502 may be coupled to the transmit path output balun 509. The transmit path output balun 509 may be a differential to single-ended balun that converts a differential output of the power amplifier 502 to a single-ended output. The transmit path input transformer 511 may be a differential to differential input matching network to provide differential input signals to the power amplifier 502. In this case, the power amplifier 502 includes a first power amplifier stage 502a, a second power amplifier stage 502b, and a third power amplifier stage 502c. Each of the power amplifier stages 502a, 502b, and 502c, respectively include transmit path input transformers 511a, 511b, and 511c, which are the loads of the power amplifier stages 502a, 502b, and 502c. A voltage supply VDD may provide power to one or more stages of the power amplifier 502. The power supply to each stage of the power amplifier 502 is fed to a center tap of a transformer associated with the output of each of the stages. Providing the power supply through the center tap of the transformer or balun is a convenient and low resistance way to bias the drain nodes of the transistors in power amplifier stages 502a, 502b, and 502c Transmit/receive (T/R) switching losses are minimized or reduced by connecting the power amplifier 502 and the low noise amplifier (LNA) 516 in shunt with each other. The output power amplifier stage 502c of the power amplifier 502 is a differential pair 503a and 503b with capacitive neutralization. The differential pair amplifier with capacitive neutralization is composed of differential common source transistors 503a and 503b. The differential common source transistors 503a and 503b provide gain or amplification. In addition, a neutralization capacitor 504a is connected between a gate of the transistor 503a and a drain of transistor 503b. Another neutralization capacitor 504b is connected between a gate of the transistor 503b and a drain of transistor 503a.

The neutralization capacitors 504a and 504b are a form of positive feedback that cancel out gate to drain capacitance that would otherwise degrade an input impedance of the power amplifier stage 502c and negatively impact stability of the power amplifier stage 502c. Because the capacitance of the neutralization capacitors 504a and 504b is specified to match the gate to drain capacitance of the transistors 503a and 503b, the neutralization capacitors 504a and 504b are created by using a gate to drain and gate to source capacitance of transistors 513a and 513b. The transistors 513a and 513b have a drain and source connected together, so they act like capacitors and not transistors. In a receive mode of operation, the power amplifier 502 is disabled to a high impedance state by grounding an output stage bias, Vbias3, as well as grounding the bias for the power amplifier stages 502b and 502a, which are Vbias2 and Vbias1, respectively. In some aspects of the disclosure, the inductor L1 is part of an input matching circuit of the low noise amplifier stage 516.

In the transmit mode of operation, the first switch Ma and the second switch Msh are both enabled, thereby protecting the input of the low noise amplifier 516 from voltage swings generated by the power amplifier 502. For example, enabling the switches Ma and Msh protects the low noise amplifier 516 from the differential power amplifier by providing a low impedance and thus preventing a large voltage swing at the input of the low noise amplifier 516, while presenting a large inductive impedance to the power amplifier 502, which along with the capacitance of the antenna node (e.g., flip chip pad) 506 is incorporated into an output match of the power amplifier 502.

Figure 6A:
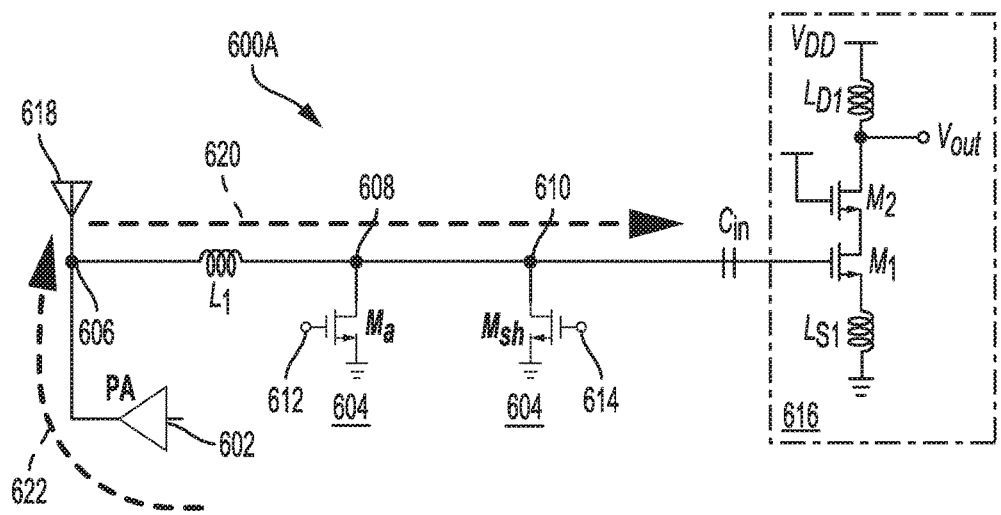
FIG. 6A is a circuit diagram of a transceiver configured in a receive mode of operation according to aspects of the present disclosure.
Figure 6B:
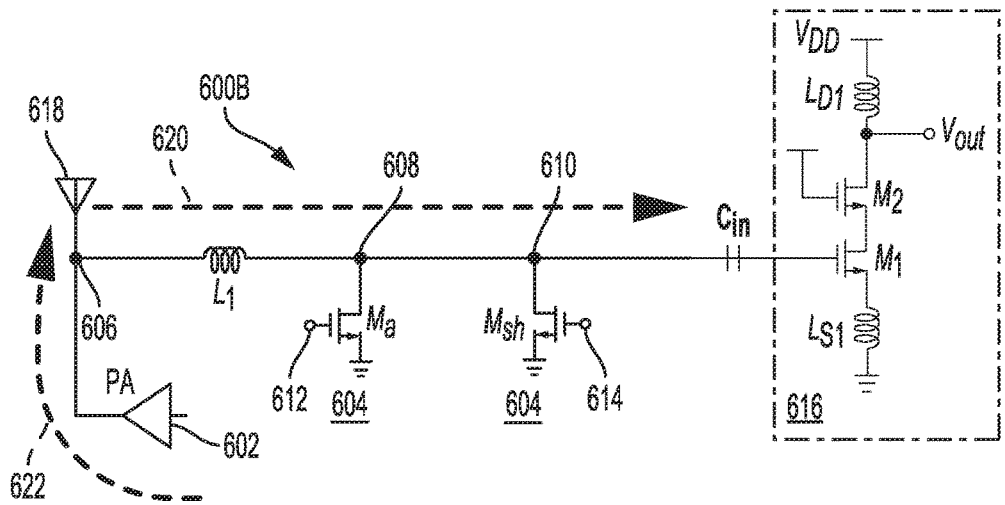
FIG. 6B is a circuit diagram of a transceiver configured in a transmit mode of operation according to aspects of the present disclosure.
Figure 6C:
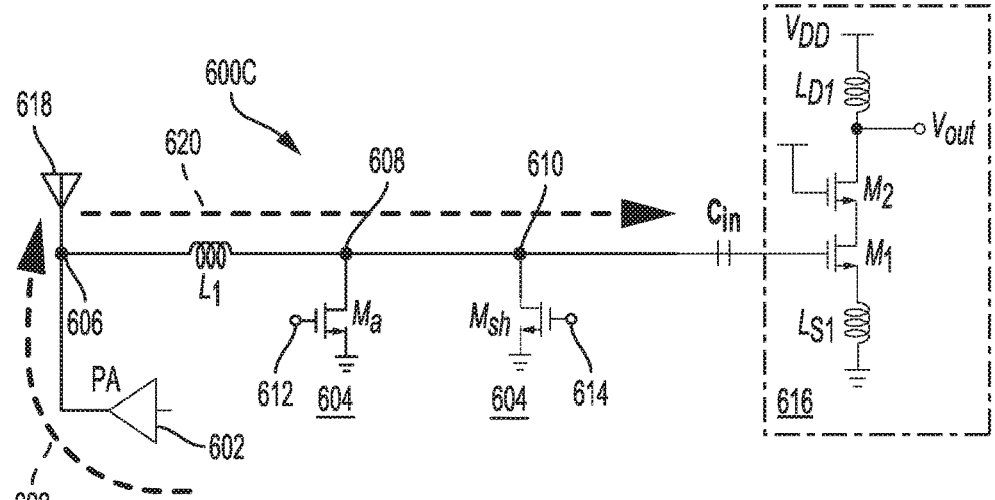
FIG. 6C is a circuit diagram of a transceiver configured in an OFF mode of operation according to aspects of the present disclosure.

The controller 525 may also be configured to cause the low noise amplifier 516 and the power amplifier 502 to be connected in accordance with a shunt configuration in a transceiver. The controller 525 may also cause the power amplifier 502 to be disabled to achieve a high impedance state by grounding a node coupled to a bias circuit that generates an output stage bias. Further the controller may enable the low noise amplifier and disable one or more transistors connected in parallel to a path between the low noise amplifier 516 and the power amplifier 502 during the receive mode FIGS. 6A-6C are circuit diagrams illustrating a tri-state mode of operation of the tri-state transmit/receive switch, according to aspects of the present disclosure. A first state of the tri-state mode of operation is represented by FIG. 6A, a second state of the tri-state mode of operation is represented by FIG. 6B and a third state of the tri-state mode of operation is represented by FIG. 6C.

FIG. 6A is a circuit diagram of a transceiver 600A configured in a receive mode of operation according to aspects of the present disclosure. The transceiver 600A includes a receive path 620 and a transmit path 622. The receive path 620 receives signals via an antenna 618 and the transmit path 622 transmits signals via the antenna 618. The transmit path 622 includes a power amplifier 602, an antenna node 606, and the antenna 618. Although not shown, a balun can be included between the power amplifier 602 and the antenna node 606. The receive path 620 includes the antenna node 606, the antenna 618, a low noise amplifier 616, a first transistor Ma, a second transistor Msh, a receive path inductor L1 and a capacitor Cin, The low noise amplifier 616 includes a first low noise amplifier transistor, M1, a second low noise amplifier transistor M2, a first low noise amplifier source degeneration inductor LS1, a second low noise amplifier load inductor LD1, an output Vout of the low noise amplifier 616 and a power supply VDD. The first transistor Ma includes a gate node 612 configured to receive a control signal, a drain node 608 coupled in shunt to the receive path 620 and a source node coupled to ground 604. The second transistor Msh includes a gate node 614 configured to receive a control signal, a drain node 610 coupled in shunt to the receive path 620 and a source node coupled to ground 604. The capacitor Cin may be coupled to an input of the low noise amplifier 616. The first transistor Ma and the second transistor Msh are coupled between the inductor L1 and the capacitor Cin. The capacitor Cin may be a DC blocking capacitor and/or a matching capacitor.

In a receive mode of operation, the power amplifier 602 is disabled to a high impedance state by grounding a bias to the power amplifier 602. The low noise amplifier 616 is enabled, and the first transistor Ma as well as the second transistor Msh are disabled. The disabled portions of the transceiver 600A are illustrated in a different line style than the enabled portions of the transceiver 600A. In this case, the power amplifier 602, and the first transistor Ma as well as the second transistor are all disabled and therefore have a similar line type. In some aspects, the inductor L1 may be part of a matching network of the low noise amplifier 616.

FIG. 6B is a circuit diagram of a transceiver 600B configured in a transmit mode of operation according to aspects of the present disclosure. For illustrative purposes, some of the labelling and numbering of the devices and features of FIG. 6B are similar to those of FIG. 6A. In the transmit mode of operation, the power amplifier 602 is enabled and the low noise amplifier 616 is disabled. The first transistor Ma and the second transistor Msh are both enabled so that a large inductive impedance from the low noise amplifier 616 is seen from an output of the power amplifier 602. The large inductive impedance may partially resonate with a capacitance of the antenna node 606 (e.g., flip chip pad capacitance). In this case, the low noise amplifier 616 is disabled and therefore has a different line style than the enabled portions of the transceiver 600B.

FIG. 6C is a circuit diagram of a transceiver 600C configured in an OFF mode of operation according to aspects of the present disclosure. For illustrative purposes, some of the labelling and numbering of the devices and features of FIG. 6C are similar to those of FIG. 6A. In a third mode of operation (e.g., an off mode), both the power amplifier 602 and the low noise amplifier 616 are disabled. The first switch Ma is enabled and the second switch Msh is disabled. The antenna 618 sees approximately fifty ohms (50Ω) because of a resistance generated by the first transistor Ma as seen through a matching network of the flip chip pad capacitance and the inductor L1.

A terminated impedance for the antenna 618 is achieved by splitting the first transistor Ma and the second transistor Msh. For example, the first transistor Ma is enabled and the second transistor Msh is disabled. Thus, when the transmitter and receiver are not used, the antenna is terminated at fifty ohms. For example, in a calibration mode with a large group of phased-array antennas (e.g., four-channel sub-arrays of antennas for the RFIC 310 of FIG. 3), the other antennas that are not being calibrated should be terminated (e.g., at fifty ohms) so that the other antennas do not affect the calibration. The calibration may include measurement of coupling between two antennas.

In some aspects of the present disclosure, a shunt switch (e.g., the first switch Ma and the second switch Msh) can be used as an attenuator in accordance with an extra low gain mode. For example, the switch can be used as an attenuator such that the low noise amplifier 616 is still on when the shunt switch is on (e.g., both the first switch Ma and the second switch Msh or just a single shunt switch) where some of the signal from the antenna 618 is diverted into the shunt switch and the rest to the low noise amplifier 616. For example, the shunt switch is controlled by a controller such that the shunt switch is partially on and presents a non-negligible impedance to the LNA input. When the shunt switch is partially on, it acts as an attenuator to attenuate the signal from the antenna 618 before the attenuated signal is provided to the low noise amplifier 616.

Figure 7:
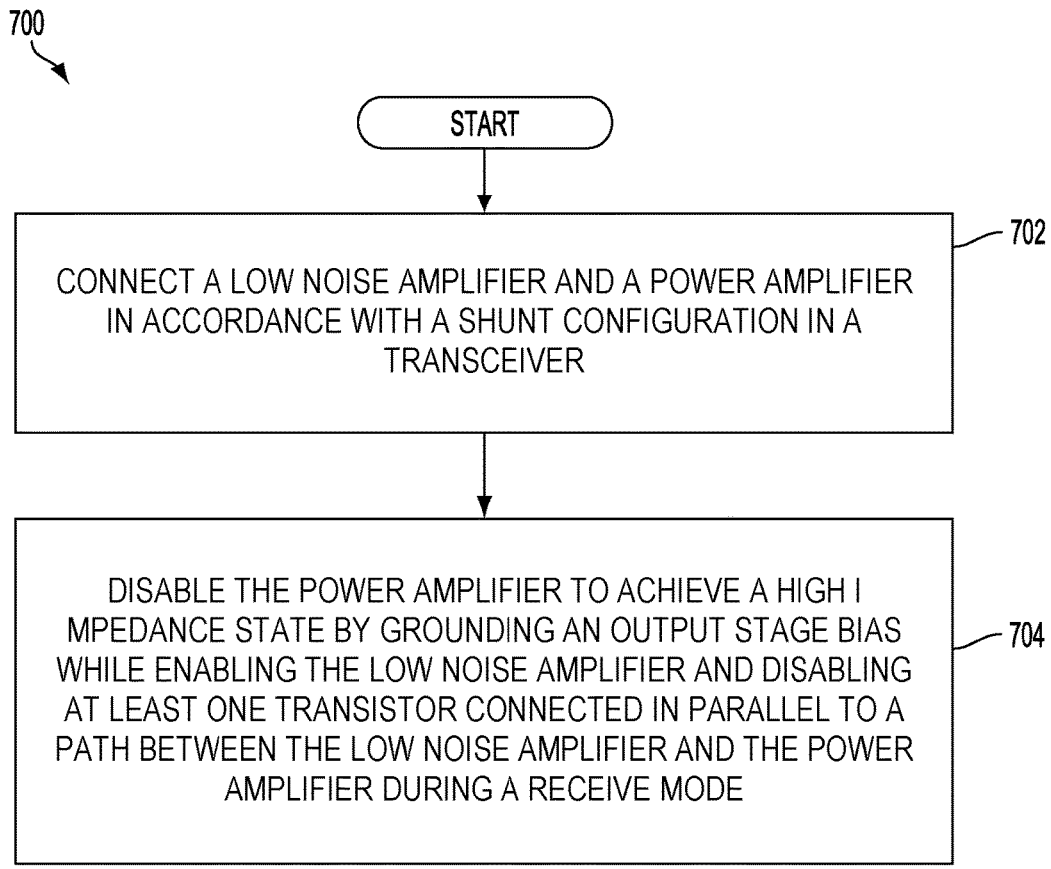
FIG. 7 depicts a simplified flowchart of an impedance matching method for a configurable power combiner and splitter.

FIG. 7 depicts a simplified flowchart of a method 700 of reducing transmitting/receiving switching losses in a transceiver according to aspects of the present disclosure. At block 702, a low noise amplifier and a power amplifier are connected in accordance with a shunt configuration in a transceiver. At block 704, the power amplifier is disabled to achieve a high impedance state by grounding an output stage bias while enabling the low noise amplifier and disabling one or more transistors connected in parallel to a path between the low noise amplifier and the power amplifier during a receive mode.

According to one aspect of the present disclosure, a transmit/receive switching circuit is described. The transmit/receive switching circuit includes means for amplifying a signal to the antenna node. The amplifying means may, for example, be the first power amplifier stage 502a, the second power amplifier stage 502b, the third power amplifier stage 502c, and/or the power amplifier 602. In another aspect, the aforementioned means may be any module or any apparatus or material configured to perform the functions recited by the aforementioned means.

Figure 8:
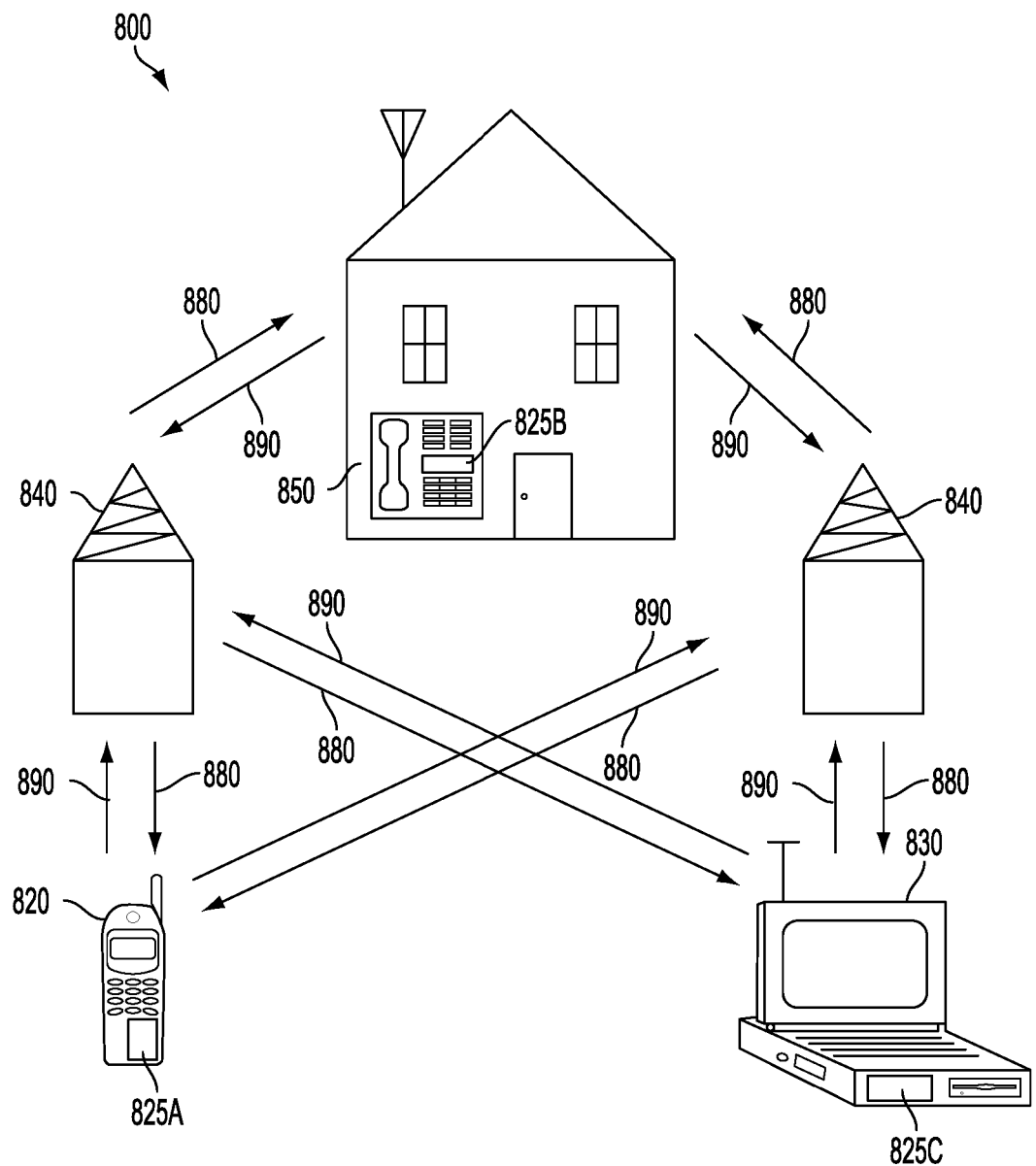
FIG. 8 is a block diagram showing an exemplary wireless communication system in which a configuration of the disclosure may be advantageously employed.

FIG. 8 is a block diagram showing an exemplary wireless communication system in which a configuration of the disclosure may be advantageously employed. For purposes of illustration, FIG. 8 shows three remote units 820, 830, and 850 and two base stations 840. It will be recognized that wireless communication systems may have many more remote units and base stations. Remote units 820, 830, and 850 include IC devices 825A, 825B, and 825C that include the disclosed transmit/receive switching circuit. It will be recognized that other devices may also include the disclosed transmit/receive switching circuit, such as the base stations, switching devices, and network equipment. FIG. 8 shows forward link signals 880 from the base station 840 to the remote units 820, 830, and 850 and reverse link signals 890 from the remote units 820, 830, and 850 to base station 840.

In FIG. 8, remote unit 820 is shown as a mobile telephone, remote unit 830 is shown as a portable computer, and remote unit 850 is shown as a fixed location remote unit in a wireless local loop system. For example, a remote unit may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieves data or computer instructions, or combinations thereof. Although FIG. 8 illustrates remote units according to the aspects of the disclosure, the disclosure is not limited to these exemplary illustrated units. Aspects of the disclosure may be suitably employed in many devices, which include the transmit/receive switching circuit.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. A transmit/receive switching circuit, comprising:
an antenna node;
a power amplifier coupled to the antenna node;
a first switch coupled to the antenna node;
a low noise amplifier coupled to the first switch, the first switch in shunt with the low noise amplifier;
an inductor having a first node coupled to the antenna node and a second node coupled to the first switch;
a second switch coupled to the antenna node via the second node of the inductor; and
a transformer coupling the power amplifier to the antenna node.

2. The transmit/receive switching circuit of claim 1, further comprising a controller configured:

to cause the power amplifier and the low noise amplifier to be disabled;
to cause the first switch to be enabled; and
to cause the second switch to be disabled during an off mode where the power amplifier and the low noise amplifier are disabled.

3. The transmit/receive switching circuit of claim 1, further comprising a capacitor between the first switch and the low noise amplifier.

4. The transmit/receive switching circuit of claim 3, in which the capacitor comprises a direct current (DC) blocking/matching capacitor.

5. The transmit/receive switching circuit of claim 1, further comprising a controller configured:
to cause the low noise amplifier and the power amplifier to be connected in accordance with a shunt configuration in a transceiver; and
to cause the power amplifier to be disabled to achieve a high impedance state by grounding a node coupled to a bias circuit that generates an output stage bias and enabling the low noise amplifier and disabling the first switch and the second switch connected in parallel to a path between the low noise amplifier and the power amplifier during a receive mode.

6. The transmit/receive switching circuit of claim 1, further comprising a controller configured:
to cause a shunt switch comprising the first switch and the second switch to be turned ON to present an attenuation impedance and act as an attenuator and to cause an attenuated signal to be provided to a receive path of the transmit/receive switching circuit;
to cause the attenuated signal to reach the low noise amplifier; and
to keep the low noise amplifier ON in an extra low gain mode.

7. The transmit/receive switching circuit of claim 1, further comprising a controller configured:
to cause the low noise amplifier to be disabled and the power amplifier to be enabled; and
to cause the first switch and the second switch to be turned ON during a transmit mode.

8. The transmit/receive switching circuit of claim 1, further comprising an antenna element coupled to the antenna node, the antenna element being part of an antenna array.

9. The transmit/receive switching circuit of claim 1, wherein the power amplifier is configured to amplify millimeter-wave signals and the low noise amplifier is configured to amplify millimeter-wave signals.

10. A transmit/receive switching circuit, comprising:
an antenna node;
means for amplifying a signal to the antenna node, the amplifying means coupled to the antenna node;
a first switch coupled to the antenna node;
a low noise amplifier coupled to the first switch, the first switch in shunt with the low noise amplifier;
an inductor having a first node coupled to the antenna node and a second node coupled to the first switch;
a second switch coupled to the antenna node via the second node of the inductor; and
a transformer coupling the amplifying means to the antenna node.

11. The transmit/receive switching circuit of claim 10, further comprising a second switch coupled to the antenna node, in which the inductor couples the antenna node to the second switch.

12. The transmit/receive switching circuit of claim 10, further comprising a controller configured:
to cause the amplifying means and the low noise amplifier to be disabled;
to cause the first switch to be enabled; and
to cause a second switch to be disabled during an off mode where the amplifying means and the low noise amplifier are disabled.

13. The transmit/receive switching circuit of claim 10, further comprising a capacitor between the first switch and the low noise amplifier.

14. The transmit/receive switching circuit of claim 13, in which the capacitor comprises a direct current (DC) blocking/matching capacitor.

15. The transmit/receive switching circuit of claim 10, further comprising a controller configured:
to cause the low noise amplifier and the amplifying means to be connected in accordance with a shunt configuration in a transceiver; and
to cause the amplifying means to be disabled to achieve a high impedance state by grounding a node coupled to a bias circuit that generates an output stage bias and enabling the low noise amplifier and disabling the first switch and the second switch connected in parallel to a path between the low noise amplifier and the amplifying means during a receive mode.

16. The transmit/receive switching circuit of claim 10, further comprising a controller configured:
to cause a shunt switch comprising the first switch and the second switch to be turned ON to present an attenuation impedance and act as an attenuator and to cause an attenuated signal to be provided to a receive path of the transmit/receive switching circuit;
to cause the attenuated signal to reach the low noise amplifier; and
to keep the low noise amplifier ON in an extra low gain mode.

* * * * *